United States Patent
Sato et al.

(10) Patent No.: US 8,216,763 B2
(45) Date of Patent: Jul. 10, 2012

(54) PHOTOSENSITIVE RESIN COMPOSITION AND METHOD OF FORMING PATTERN

(75) Inventors: Kazufumi Sato, Kanagawa (JP); Yasushi Fujii, Kanagawa (JP); Hisanobu Harada, Kanagawa (JP); Koji Yonemura, Kanagawa (JP); Isamu Takagi, Kanagawa (JP); Daisuke Kawana, Kanagawa (JP); Tomotaka Yamada, Kanagawa (JP); Toshikazu Takayama, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 764 days.

(21) Appl. No.: 12/092,701

(22) PCT Filed: Oct. 10, 2006

(86) PCT No.: PCT/JP2006/320228
§ 371 (c)(1),
(2), (4) Date: Mar. 16, 2009

(87) PCT Pub. No.: WO2007/055079
PCT Pub. Date: May 18, 2007

(65) Prior Publication Data
US 2009/0220889 A1 Sep. 3, 2009

(30) Foreign Application Priority Data
Nov. 10, 2005 (JP) .................. 2005-326649

(51) Int. Cl.
*G03F 7/004* (2006.01)
*G03F 7/30* (2006.01)

(52) U.S. Cl. .................. 430/270.1; 430/323; 430/326

(58) Field of Classification Search ............... 430/270.1, 430/323, 326
See application file for complete search history.

(56) References Cited

U.S. PATENT DOCUMENTS

| | | | |
|---|---|---|---|
| 2003/0224288 A1* | 12/2003 | Kodama | 430/270.1 |
| 2005/0019689 A1* | 1/2005 | Kodama | 430/270.1 |
| 2005/0095532 A1* | 5/2005 | Kodama et al. | 430/270.1 |
| 2007/0059639 A1* | 3/2007 | Kanda et al. | 430/270.1 |

FOREIGN PATENT DOCUMENTS

| | | |
|---|---|---|
| JP | 2004-334107 A | 11/2004 |
| WO | 2004/055598 A1 | 7/2004 |
| WO | 2004/076535 A1 | 9/2004 |

* cited by examiner

*Primary Examiner* — John Chu
(74) *Attorney, Agent, or Firm* — Pattric J. Rawlins; Procopio Cory Hargreaves & Savitch LLP

(57) ABSTRACT

A photosensitive resin composition which has a quenching function and satisfactory long-term stability and which, in particular, can be prevented from suffering sensitivity abnormality caused by change with time during storage (change from given sensitivity); and a method of forming a pattern from the composition. The resist composition contains a base resin comprising, as the main component, a silicon-containing polymer which is a siloxane or silsesquioxane polymer or the like, the composition containing, as a quencher, a specific sulfonium compound in place of a nitrogenous compound.

14 Claims, 1 Drawing Sheet

PHOTOSENSITIVE RESIN COMPOSITION AND METHOD OF FORMING PATTERN

CROSS-REFERENCE TO RELATED APPLICATION

This application claims priority to and the benefit of PCT Patent Application No. PCT/JP2006/320228, filed Oct. 10, 2006, which claims priority to Japanese Patent Application number 2005-326649, filed Nov. 10, 2005. All of these applications/patent(s) are incorporated by reference as though set forth in full.

TECHNICAL FIELD

The present invention relates to a photosensitive resin composition including a particular sulfonium compound as a quencher, and a method for pattern formation using the composition. More particularly, the present invention relates to a photosensitive resin composition which can be stored for a long period of time with favorable resist characteristics with time, and a method for pattern formation using the composition.

BACKGROUND ART

To meet the needs for high degree of integration and miniaturization of semiconductor elements in recent years, multilayer resist methods which may readily achieve a high aspect ratio with high dimensional accuracy have been investigated for the purpose of forming a micropattern. As a resist material for use in this multilayer resist method, one having a bilayer structure including a positive type resist layer as the upper layer, and an organic resin layer as the lower layer has been examined. For the positive type resist layer as this upper layer, use of a silicon-containing polymer compound with high resistance to oxygen plasma has been studied.

As a composition for such a positive type resist, for example, a chemically amplified composition that includes a base resin having a property to increase the solubility in an aqueous alkaline solution by the action of an acid, an acid generator that generates an acid in response to an electromagnetic wave or the like, and a nitrogen-based organic basic compound (quencher) having a carbamate group, an amide group or the like which can control diffusion of acid from the acid generator may be used (see, Patent Document 1).
Patent Document 1: Japanese Patent Application Publication No. 2004-334107.

DISCLOSURE OF THE INVENTION

Problems to be Solved by the Invention

However, it is difficult to keep sufficient stability with time in resist compositions in which a base resin that includes a siloxane-based or silsesquioxane-based silicon-containing polymer compound is used as a principal component, when a nitrogen-based organic basic compound is used as a quencher because the pH greatly varies resulting from the unstable property of the nitrogen-based compound. In particular, means for improvement of abnormal sensitivity (change from certain sensitivity) due to the time-dependent alteration has been strongly desired.

The present invention was made in view of the foregoing problems, and an object of the invention is to provide a photosensitive resin composition which exhibits favorable stability with time while having a quenching property and which can particularly prevent abnormal sensitivity due to time-dependent alteration during the storage, and a method for pattern formation using the composition.

Means for Solving the Problems

In order to solve the aforementioned problems, the present inventors elaborately investigated quenchers accompanied by less variation of the pH during storage. Consequently, it was found that the aforementioned problems can be solved by using a particular sulfonium compound as quencher in place of the nitrogen-based compound. Accordingly, the present invention was accomplished. More specifically, the present invention provides the following.

A first aspect of the present invention provides a photosensitive resin composition including (A) a base resin having a property to increase the solubility in an aqueous alkaline solution by the action of an acid, (B) an acid generator that generates an acid in response to an electromagnetic wave, and (C) a quencher that captures the acid, in which the base resin (A) includes a silicon-containing polymer compound; and the quencher (C) includes a sulfonium compound represented by the following general formula (1)

(1)

wherein R1, R2 and R3 each independently represent an alkyl group, a cycloalkyl group which may have a substituent, or an aryl group which may have a substituent.

In the photosensitive resin composition of the first aspect, combination of the base resin (A) including a silicon-containing polymer compound and the quencher (C) including a particular sulfonium compound enables variation in the pH of the composition during storage to be suppressed, as compared with the case of conventional quenchers that include an amine-based compound. Therefore, favorable stability with time of the resist composition is achieved, and in particular, abnormal sensitivity (change from desired sensitivity) due to the time-dependent alteration during storage can be prevented, whereby storage for a longer period of time is consequently enabled.

A second aspect of the invention provides the photosensitive resin composition according to the first aspect in which the quencher (C) includes a triphenyl compound represented by the following formula (2):

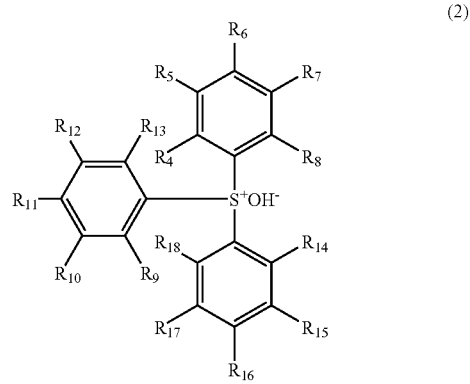

(2)

wherein $R_4$ to $R_{18}$ each independently represent a hydrogen atom, a halogen atom, or an alkyl group having 1 to 20 carbon atoms.

The photosensitive resin composition of the second aspect includes a particular triphenylsulfonium compound as the quencher (C). Because three phenyl groups having electron-donating ability are bound to a sulfur atom in triphenylsulfonium compounds, generation of a base can be suppressed during storage, while upon irradiation of an electromagnetic wave, a base can be generated in response to the electromagnetic wave. Therefore, variation of the pH in the composition during storage can be further suppressed, and thus abnormal sensitivity due to the time-dependent alteration during storage can be further prevented, whereby storage for a still longer period of time is enabled.

A third aspect of the present invention provides the photosensitive resin composition according to the first aspect in which the quencher (C) includes a tricyclohexyl compound represented by the following general formula (3):

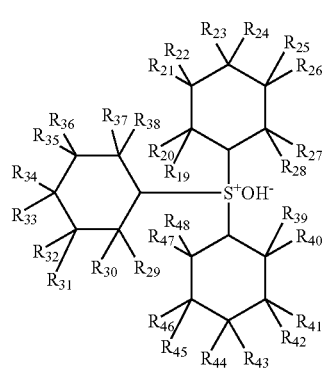

(3)

wherein $R_{19}$ to $R_{48}$ each independently represent a hydrogen atom, a halogen atom, or an alkyl group having 1 to 20 carbon atoms.

The photosensitive resin composition according to the third aspect includes a particular tricyclohexylsulfonium compound the as the quencher (C). The tricyclohexylsulfonium compound exhibits steric hindrance because three bulky tricyclohexyl groups are bound to the sulfur atom therein. Thus, generation of a base can be suppressed during storage since attack from other compound is depressed, while upon irradiation of an electromagnetic wave, a base can be generated in response to the electromagnetic wave. Therefore, the composition including the particular tricyclohexylsulfonium compound as the quencher (C) can further suppress the variation of the pH in the composition during storage, whereby a similar effect to that achieved by the second aspect described above can be exhibited.

A fourth aspect of the present invention provides the photosensitive resin composition according to any one of the first to the third aspects in which the base resin (A) includes a silsesquioxane resin.

Since the base resin (A) of the photosensitive resin composition of the fourth aspect includes a silsesquioxane resin, time-dependent deterioration of the characteristics typified by abnormal sensitivity during storage can be avoided, and a pattern with high resistance to oxygen plasma and an excellent cross-sectional shape can be obtained.

A fifth aspect of the present invention provides the photosensitive resin composition according to the first aspect in which: the base resin (A) includes a silsesquioxane resin having an $HSiO_{3/2}$ unit, and an $RSiO_{3/2}$ unit, wherein R is an acid-dissociable group represented by the following general formula (4):

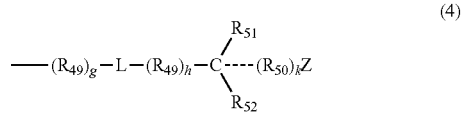

(4)

wherein:
$R_{49}$ is each independently a linking group;
$R_{50}$ is the second linking group;
L is selected from the group consisting of a linear or branched alkylene group having 1 to 10 carbon atoms, a fluoroalkylene group, a substituted or unsubstituted arylene group, a substituted or unsubstituted cycloalkylene group, and a substituted or unsubstituted alkarylene group having 2 to 20 carbon atoms;
$R_{51}$ is a hydrogen atom, or a linear or branched alkyl group or fluoroalkyl group;
$R_{52}$ is an alkyl group or a fluoroalkyl group;
Z is a group that is dissociable by an acid;
g represents an integer of 0 or 1;
h represents an integer of 0 or 1; and
k represents an integer of 0 or 1.

The photosensitive resin composition of the fifth aspect can improve the lithography characteristics such as etching resistance, transparency, resolution, sensitivity, focal point margin, line edge roughness and the adhesive properties by including a silsesquioxane resin having a particular acid-dissociable group as the base resin (A).

A sixth aspect of the present invention provides the photosensitive resin composition according to the first aspect in which the content of the acid generator (B) is from 0.5 parts by mass to 30 parts by mass per 100 parts by mass of the base resin (A).

The content of the acid generator (B) in the photosensitive resin composition of the sixth aspect is from 0.5 parts by mass to 30 parts by mass per 100 parts by mass of the base resin (A). When the content of the acid generator (B) is no less than 0.5 parts by mass, definite generation of the acid in the exposure process, adequate decomposition of the base resin (A) which constitutes the composition, and maintenance of the solubility in an aqueous alkaline solution are enabled, whereby pattern formation can be sufficiently executed. Meanwhile, when the content is no more than 30 parts by mass, a uniform solution can be obtained, thereby capable of improving the storage stability.

A seventh aspect of the present invention provides the photosensitive resin composition according to the first aspect in which the content of the quencher (C) is from 0.01 parts by mass to 5.0 parts by mass per 100 parts by mass of the base resin (A).

Defining the content of the quencher (C) in the photosensitive resin composition of the seventh aspect to be from 0.01 parts by mass to 5.0 parts by mass per 100 parts by mass of the base resin (A) can preclude the acid generated in the exposure step from diffusing to the unexposed region and can prevent the damage and collapse of the pattern.

An eighth aspect of the present invention provides the photosensitive resin composition according to the first aspect which further includes an organic acid (D) in an amount of 0.01 parts by mass to 5.0 parts by mass per 100 parts by mass of the base resin (A).

According to the photosensitive resin composition of the eighth aspect, compounding from 0.01 parts by mass to 5.0 parts by mass of the organic acid (D) per 100 parts by mass of the base resin (A) can suppress the deterioration of sensitivity caused by adding the quencher (C) and the dependency on the substrate, and can improve the shape of the resist pattern, time-dependent storage stability and the like.

A ninth aspect of the present invention provides the photosensitive resin composition according to the first aspect which is a composition for a resist.

The photosensitive resin composition of the ninth aspect is used in the field of applications of forming a resist. According to the photosensitive resin composition of the present invention, abnormal sensitivity by the time-dependent alteration during the storage can be prevented, and a resist for lithography that is excellent in etching resistance, transparency, resolution, focal point latitude, line edge roughness, and adhesive properties can be obtained.

A tenth aspect of the present invention provides the photosensitive resin composition according to the first aspect which is a composition for an upper layer resist of a bilayer resist system.

The photosensitive resin composition of the tenth aspect is used as the upper layer resist of bilayer resist systems.

Even if the thickness of the coating layer obtained by coating the photosensitive resin composition of the present is reduced, enough etching resistance is provided. Therefore, it is not necessary to make a trilayer system for the purpose of imparting the etching resistance, whereby operation process in the pattern formation can be simplified.

In addition, even if a pattern with a high aspect ratio is to be formed, the photosensitive resin composition of the present invention enables the upper layer film to be thinned. In general, when the upper layer film is thinned, edge roughness such as line edge roughness or edge roughness of the hole pattern tends to be marked while the resolution improves. However, since the upper layer film constituted with the photosensitive resin composition of the present invention exhibits suitable solubility in alkali even though it is thinned, high resolution can be attained, and occurrence of the edge roughness can be reduced.

An eleventh aspect of the present invention provides the photosensitive resin composition according to the first aspect which is a composition for an upper layer resist of a bilayer resist system having an organic polymer film as the lower layer.

The photosensitive resin composition of the eleventh aspect is used for an upper layer resist of a bilayer resist system having an organic polymer film as the lower layer. By using the organic polymer film as the lower layer, etching with an oxygen-based plasma and/or reactive ion is enabled, whereby the environmental issue in these days can be dealt with.

A twelfth aspect of the present invention provides a method for pattern formation by lithography on a workpiece film including the steps of: forming a lower layer film on a workpiece film; forming an upper layer film by coating the photosensitive resin composition according to the first aspect on the lower layer film to obtain an upper layer film; exposing the upper layer film to obtain an exposed film including at least in part an exposed region; and developing the exposed film by treating with a developer to selectively dissolve the exposed region of the upper layer film thereby obtaining a resist film having a pattern formed thereon constituted with the photosensitive resin composition.

The method for pattern formation of the twelfth aspect is a method for forming a pattern using the photosensitive resin composition of the present invention by lithography by means of a bilayer resist system with a step of forming a lower layer film; a step of forming an upper layer film; a step of exposure; and a step of development. Even if the thickness of the coating layer obtained by coating the photosensitive resin composition of the present invention is reduced, enough etching resistance is provided, and also, even though a pattern with a high aspect ratio is to be formed, the upper layer film can be thinned. Thus, the method for pattern formation by means of the bilayer resist system enables to provide a pattern having an excellent cross-sectional shape as well as low line edge roughness and edge roughness of the hole pattern (may be also referred to as "edge roughness" in combination), with high sensitivity and high resolution.

A thirteenth aspect of the present invention provides the method for pattern formation according to the twelfth aspect in which the lower layer film is an organic polymer film.

A fourteenth aspect of the present invention provides the method for pattern formation according to the twelfth or thirteenth aspect which includes the step of etching after the development step to etch the lower layer film by a plasma and/or reactive ion using the resist film as a mask.

In the method for pattern formation of the fourteenth aspect, the pattern of the upper layer resist film constituted with the photosensitive resin composition of the present invention is used as a mask to etch the lower resist film. Because the resist film constituted with the photosensitive resin composition of the present invention has enough etching resistance, the pattern of the lower layer film with a high aspect ratio is provided, and in addition, the resolution can be increased and problems of the focal depth can be avoided.

A fifteenth aspect of the present invention provides the method for pattern formation according to the fourteenth aspect in which the plasma and/or reactive ion includes oxygen.

In the method for pattern formation of the fifteenth aspect, the plasma and/or reactive ion which includes oxygen is used. Because the plasma and/or reactive ion including oxygen has been used universally, it is advantageous in terms of high availability. In addition, a pattern with high resolution can be obtained. Also, when the plasma and/or reactive ion including oxygen is used, high etching resistance can be realized by selecting a silsesquioxane resin for use in combination as the base resin (A).

Effects of the Invention

According to the present invention, compared with the case in which a conventional nitrogen-based compound is used as a quencher, variation of the pH in the composition during storage can be suppressed. Therefore, even in the case of a resist composition in which a base resin including a silicon-containing polymer compound such as a siloxane-based or silsesquioxane-based compound as a principal component is used, the stability over time of the composition can be favorable, and in particular, abnormal sensitivity due to time-dependent alteration during storage can be prevented.

Also, since the upper layer film constituted with the photosensitive resin composition of the present invention exhibits suitable solubility in alkali even though it is thinned, high resolution can be attained, and occurrence of the edge roughness can be reduced.

Even more particularly, the shape of a resist pattern provided from the photosensitive resin composition of the present invention has a high aspect ratio, and has excellent verticality without pattern collapse.

PREFERRED MODE FOR CARRYING OUT THE INVENTION

Photosensitive Resin Composition (Resist Composition)

Figure 1A:
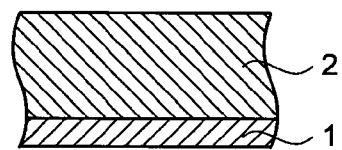
FIG. 1A to FIG. 1F shows a process chart of the method for pattern formation according to the present invention.

The photosensitive resin composition of the present invention is described below. The photosensitive resin composition (hereinafter, may be also referred to as "positive type resist composition" or "resist composition") of the present invention includes (A) a base resin having a property to increase the solubility in alkali by the action of an acid, (B) an acid generator that generates an acid in response to an electromagnetic wave, and (C) a quencher that captures the generated acid. [Base Resin (A)]

The base resin (A) of the present invention is a resin including a silicon-containing polymer compound. Although the silicon-containing polymer compound is not particularly limited, for example, siloxane-based polymer compounds having an Si—O bond in the main chain, silicon carbide-based polymer compounds having an Si—C bond in the main chain, polysilane-based polymer compounds having an Si—Si bond in the main chain, silazane-based polymer compounds having an Si—N bond in the main chain, and the like may be herein exemplified. Also, an arbitrary mixture of these can be used. The compound can be selected appropriately so that a great selection ratio to the used workpiece film (substrate) is attained.

Additionally, in the present invention, the base resin (A) may further include a known various resin, in addition to the silicon-containing polymer compound.

The base resin (A) in the present invention is preferably a siloxane-based polymer compound, and particularly preferably a resin including a silsesquioxane resin (A1) as a principal component. When the principal component of the base resin (A) is a silsesquioxane resin, a pattern having an excellent cross-sectional shape can be obtained even after subjecting to a heating process, since resistance to oxygen plasma can be improved and excellent heat resistance can be achieved, while precluding time-dependent deterioration of the characteristics typified by abnormal sensitivity during storage. The proportion of the silsesquioxane resin (A1) in the base resin (A) is preferably no less than 70% by mass, more preferably no less than 80% by mass, and most preferably 100% by mass.

As a preferable silsesquioxane resin (A1), the silsesquioxane resin which includes an HSiO$_{3/2}$ unit and an RSiO$_{3/2}$ unit, wherein R is an acid-dissociable group represented by the following general formula (4), may be exemplified.

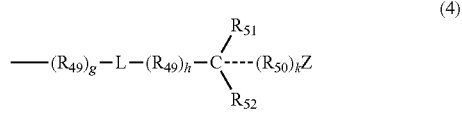

(4)

wherein R$_{49}$ is each independently a linking group;
R$_{50}$ is the second linking group;
L is selected from the group consisting of a linear or branched alkylene group having 1 to 10 carbon atoms, a fluoroalkylene group, a substituted or unsubstituted arylene group, a substituted or unsubstituted cycloalkylene group, and a substituted or unsubstituted alkarylene group having 2 to 20 carbon atoms;
R$_{51}$ is a hydrogen atom, or a linear or branched alkyl group or fluoroalkyl group;
R$_{52}$ is an alkyl group or a fluoroalkyl group;
Z is a group that is dissociable by an acid;
g represents an integer of 0 or 1;
h represents an integer of 0 or 1; and
k represents an integer of 0 or 1.
[Acid Generator (B)]

As the acid generator (B), a properly selected optional one from among known acid generators in conventional chemically amplified resists can be used. Examples of the acid generator (B) include e.g., onium salt-based acid generators such as iodonium salts and sulfonium salts, oximesulfonate-based acid generators, diazomethane-based acid generators such as bisalkyl or bisaryl sulfonyl diazomethanes, poly(bissulfonyl)diazomethanes and diazomethanenitrobenzyl sulfonates, iminosulfonate-based acid generators, disulfone-based acid generators, and the like. Also, in the present invention, the acid generator (B) may be used alone, or in combination of two or more.

The amount of compounded acid generator (B) may be from 0.5 parts by mass to 30 parts by mass, and preferably from 1 part by mass to 10 parts by mass per 100 parts by mass of the base resin (A). Pattern formation is executed sufficiently by compounding in an amount of no less than 0.5 parts by mass, while storage stability is improved by compounding in an amount of no less than 30 parts by mass because a homogeneous solution is provided. Specific examples of the onium salt-based acid generator include trifluoromethanesulfonate or nonafluorobutanesulfonate of diphenyliodonium, trifluoromethanesulfonate or nonafluorobutanesulfonate of bis(4-tert-butylphenyl)iodonium, trifluoromethanesulfonate, heptafluoropropanesulfonate or nonafluorobutanesulfonate of triphenylsulfonium, trifluoromethanefulfonate, heptafluoropropanesulfonate or nonafluorobutanesulfonate of tri(4-methylphenyl)sulfonium, trifluoromethanesulfonate, heptafluoropropanesulfonate or nonafluorobutanesulfonate of (4-methylphenyl)diphenylsulfonium, trifluoromethanesulfonate, heptafluoropropanesulfonate or nonafluorobutanesulfonate of (4-methoxyphenyl)diphenylsulfonium, trifluoromethanesulfonate, heptafluoropropanesulfonate or nonafluorobutanesulfonate of dimethyl(4-hydroxynaphthyl)sulfonium, trifluoromethanesulfonate, heptafluoropropanesulfonate or nonafluorobutanesulfonate of monophenyldimethylsulfonium, and the like. Among these, onium salts having a fluorinated alkylsulfonate ion as an anion can be preferably used.

Specific examples of the oximesulfonate-based acid generators include α-(methylsulfonyloxyimino)-phenylacetonitrile, α-(methylsulfonyloxyimino)-p-methoxyphenylacetonitrile, α-(trifluoromethylsulfonyloxyimino)-phenylacetonitrile, α-(trifluoromethylsulfonyloxyimino)-p-methoxyphenylacetonitrile, α-(ethylsulfonyloxyimino)-p-methoxyphenylacetonitrile, α-(propylsulfonyloxyimino)-p-methylphenylacetonitrile, α-(methylsulfonyloxyimino)-p-bromophenylacetonitrile, bis-O-(n-butylsulfonyl)-α-dimethylglyoxime, and the like. Among these, α-(methylsulfonyloxyimino)-p-methoxyphenylacetonitrile, bis-O-(n-butylsulfonyl)-α-dimethylglyoxime can be preferably used.

Specific examples of the diazomethane-based acid generator include bisalkylsulfonyldiazomethane having a linear or branched alkyl group having 1 to 4 carbon atoms such as bis(n-propylsulfonyl)diazomethane, bis(isopropylsulfonyl)diazomethane, bis(n-butylsulfonyl)diazomethane, bis (isopropylsulfonyl)diazomethane, and bis(tert-butylsulfonyl)diazomethane; bisalkylsulfonyldiazomethane having a cyclic alkyl group having 5 to 6 carbon atoms such as bis(cyclopentylsulfonyl)diazomethane, and bis(cyclohexylsulfonyl)diazomethane; bisarylsulfonyldiazomethane having an aryl group such as bis(p-toluenesulfonyl)diazomethane, and bis(2,4-dimethylphenylsulfonyl)diazomethane; and the like.

Moreover, examples of the poly(bissulfonyl)diazomethane include, e.g., 1,3-bis(phenylsulfonyldiazomethylsulfonyl)propane (when A is 3), 1,4-bis(phenylsulfonyldiazomethylsulfonyl)butane (when A is 4), 1,6-bis(phenylsulfonyldiazomethylsulfonyl)hexane (when A is 6), 1,10-bis(phenylsulfonyldiazomethylsulfonyl)decane (when A is 10), 1,2-bis(cyclohexylsulfonyldiazomethylsulfonyl)ethane (when B is 2), 1,3-bis(cyclohexylsulfonyldiazomethylsulfonyl)propane (when B is 3), 1,6-bis(cyclohexylsulfonyldiazomethylsulfonyl)hexane (when B is 6), 1,10-bis(cyclohexylsulfonyldiazomethylsulfonyl)decane (when B is 10), and the like having a structure represented by the following general formula (5):

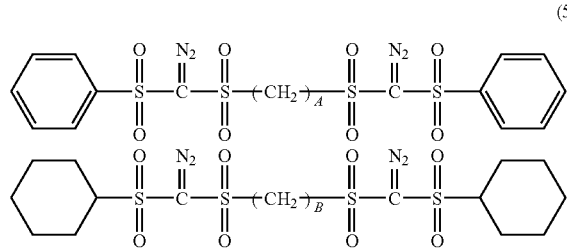

(5)

In the present invention, use of the onium salt as the acid generator (B) is preferred in terms of excellent width in the depth of focus and exposure margin. Also, use of diazomethane is preferred because circularity of the resist hole pattern can be improved, and standing waves of the cross-sectional pattern can be suppressed.

Also, in the present invention, to include the onium salt-based acid generator having perfluoroalkylsulfonate having 3 or 4 carbon atoms as an anion (hereinafter, may be abbreviated to C3-4 onium salt) as the acid generator (B) is preferred because masking linearity is improved, and the pattern can be strictly reproduced with the mask even though the pattern involves a variety of sizes, and because one that is excellent in the proximity effect, DOF, exposure margin and the like can be obtained. The alkyl group of the perfluoroalkylsulfonate may be either linear or branched, but a linear one is preferred.

When the C3-4 onium salt is compounded as the acid generator (B), the amount of the C3-4 onium salt in total amount of the acid generator (B) accounts for preferably 50% to 100% by mass.

Furthermore, when the C3-4 onium salt is compounded as the acid generator (B), it is preferred that the onium salt-based acid generator having perfluoroalkylsulfonate having one carbon atom (hereinafter, may be abbreviated to C1 onium salt) be further used in combination.

Moreover, in light of the advantages of the present invention, use of a sulfonium salt among the onium salt is desired.

In addition, a triphenylsulfonium salt is preferably used among the sulfonium salts. When the triphenylsulfonium salt is compounded, the amount thereof may be preferably 30 to 100 mol %, and more preferably 50 to 100 mol % per total amount of the acid generator (B).

In particular, mixing the onium salt and diazomethane is preferred because the circularity of the resist hole pattern can be improved without deteriorating the width in the depth of focus and exposure margin, and the standing waves of the cross-sectional pattern can be suppressed. When this mixture is used, the content of the onium salt in the mixture is preferably 20 to 90 mol %, and more preferably 30 to 70 mol %.

Moreover, among the triphenylsulfonium salts, triphenylsulfonium salts having the perfluoroalkylsulfonate ion as an anion represented by the following general formula (6) are particularly preferably used because high sensitivity can be achieved:

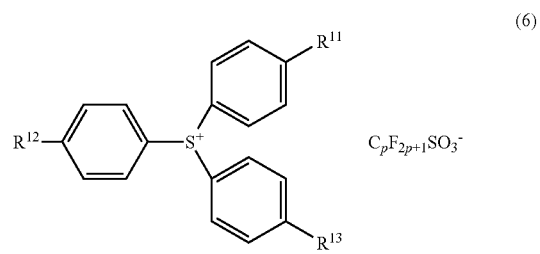

(6)

wherein $R^{11}$, $R^{12}$, and $R^{13}$ each independently represent a hydrogen atom, a lower alkyl group having 1 to 8, and preferably 1 to 4 carbon atoms, or a halogen atom such as chlorine, fluorine, or bromine, p represents an integer of 1 to 12, preferably 1 to 8, and more preferably 1 to 4.

[Quencher (C)]

The photosensitive resin composition of the present invention includes the quencher (C) which captures the acid generated from the acid generator (B) in the photosensitive resin composition, for the purpose of improving the time-dependent stability.

In the present invention, an agent including a sulfonium compound represented by the following general formula (1) is used as the quencher (C).

(1)

wherein $R_1$, $R_2$ and $R_3$ each independently represent an alkyl group, a cycloalkyl group which may have a substituent, or an aryl group which may have a substituent.

The amount of the compounded quencher (C) may fall within the range of preferably from 0.01 parts by mass to 5.0 parts by mass, more preferably from 0.05 parts by mass to 4.0 parts by mass, and particularly preferably 0.1 parts by mass to 3.0 parts by mass per 100 parts by mass of the base resin (A).

Examples of the sulfonium compound represented by the above general formula (1) preferably used as the quencher (C) of the present invention include triphenyl compounds represented by the following general formula (2):

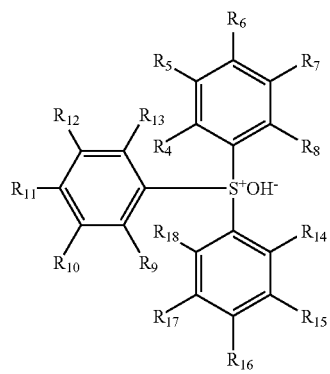

(2)

wherein $R_4$ to $R_{18}$ each independently represent a hydrogen atom, a halogen atom, or an alkyl group having 1 to 20 carbon atoms.

Also, other examples of the sulfonium compound represented by the above general formula (1) which are preferably used as the quencher (C) of the present invention include tricyclohexyl compounds represented by the following general formula (3):

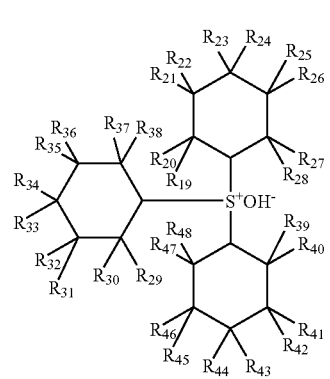

(3)

wherein $R_{19}$ to $R_{48}$ each independently represent a hydrogen atom, a halogen atom, or an alkyl group having 1 to 20 carbon atoms.

The quencher (C) in the present invention may be the sulfonium compound represented by the above general formula (5) used alone, or a may be a combination thereof with one or more compound other than the sulfonium compound.

In the present invention, as the component of the quencher (C) other than the sulfonium compound, for example, a nitrogen-containing organic compound can be used in combination. Examples of preferred nitrogen-containing organic compound include aliphatic amine, and particularly secondary aliphatic amine, tertiary aliphatic amine, and the like.

Specific examples of the aliphatic amine include amine (alkylamine or alkylalcoholamine) yielded by substituting at least one hydrogen atom of ammonia (NH3) with an alkyl group or a hydroxyalkyl group having 12 or less carbon atoms. Further specific examples of the aliphatic amine include monoalkylamine such as n-hexylamine, n-heptylamine, n-octylamine, n-nonylamine, and n-decylamine; dialkylamine such as diethylamine, di-n-propylamine, di-n-heptylamine, di-n-octylamine, and dicyclohexylamine; trialkylamine such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; alkylalcoholamine such as diethanolamine, triethanolamine, diisopropanolamine, triisopropanolamine, di-n-octanolamine, and tri-n-octanolamine, and the like. Among these, alkylalcoholamine or trialkylamine are preferred, and alkylalcoholamine is most preferred. In particular, triethanolamine or triisopropanolamine is most preferred among alkylalcoholamine.

Other Components

The photosensitive resin composition of the present invention may further include optional components in addition to the base resin (A), the acid generator (B), and the quencher (C). Examples of the optional component include, e.g., an organic acid (D), a dissolution inhibitor, other additives and the like.

[Organic Acid (D)]

The organic acid (D) may be included as an optional component of the photosensitive resin composition of the present invention for the purpose of preventing deterioration of sensitivity resulting from compounding the quencher (C), and improving the shape of resist pattern, time-dependent storage stability, and the like. The organic acid (D) which may be used is not particularly limited, and for example, an organic carboxylic acid, or an oxo acid of phosphorous or a derivative thereof may be included. The organic acid (D) may be used alone or in combination of two or more.

The content of the organic acid (D) when compounded may fall within the range of preferably from 0.01 parts by mass to 5.0 parts by mass, more preferably from 0.05 parts by mass to 4.0 parts by mass, and particularly preferably from 0.1 parts by mass to 3.0 parts by mass per 100 parts by mass of the base resin (A).

Examples of the organic carboxylic acid which can be suitably used include, e.g., malonic acid, citric acid, malic acid, succinic acid, benzoic acid, salicylic acid, and the like. Examples of the oxo acid of phosphorous or derivatives thereof include phosphoric acid or derivatives such as esters thereof such as, e.g., phosphoric acid, phosphoric acid di-n-butyl ester, and phosphoric acid diphenyl ester; phosphonic acid and derivatives such as esters thereof such as, e.g., phosphonic acid, phosphonic acid dimethyl ester, phosphonic acid di-n-butyl ester, phenylphosphonic acid, phosphonic acid diphenyl ester, and phosphonic acid dibenzyl ester; phosphinic acid and derivatives such as esters thereof such as, e.g., phosphinic acid, and diphenylphosphinic acid. Among these, phosphonic acid is particularly preferred.

[Other Additives]

The photosensitive resin composition of the present invention may further include therein an additive if desired that is miscible with the composition, such as e.g., an additional resin for improving the performances of the resulting resist film, a surface active agent for improving the coating properties, a dissolution inhibitor, a plasticizer, a stabilizer, a colorant, an antihalation agent, and the like.

[Dissolution Inhibitor]

In the photosensitive resin composition of the present invention, the dissolution inhibitor is included as an optional component. When the dissolution inhibitor is included in the photosensitive resin composition, line edge roughness can be improved efficiently.

The line edge roughness herein refers to uneven irregularity of the line lateral wall, and $3\sigma$ is usually determined as a standard that represents the line edge roughness of the line and space pattern. The $3\sigma$ is determined by measuring the width of the resist pattern of the sample at 32 sites with, for example, critical dimension SEM (manufactured by Hitachi, Ltd. Corporation, product name: S-9220), deriving the standard deviation (σ) calculated from the results, and triplicating the S.D. value to give (3σ). The smaller the 3σ value, the less roughness suggested, thereby meaning that a resist pattern with a uniform width was provided.

When a dissolution inhibitor is compounded, one may be used alone, or two or more may be used as a mixture. Also, when a dissolution inhibitor is included in the photosensitive resin composition of the present invention, the content falls within the range of preferably from 1 part by mass to 40 parts by mass, and more preferably from 10 parts by mass to 30 parts by mass per 100 parts by mass of the base resin (A). When the content of the dissolution inhibitor is not less than the lower limit, the effect of addition can be achieved enough. Whereas, when the content is not higher than the upper limit, deterioration of the pattern shape, and deleterious change of the lithography characteristics can be suppressed.

Examples of the dissolution inhibitor include compounds having a phenolic hydroxy group at least one hydrogen atom of which is substituted with an acid-dissociable dissolution inhibitory group, and known dissolution inhibitor which has been already used in chemically amplified positive type resist compositions of three-component system can be used. As the dissolution inhibitor, those having a mass average molecular weight of no greater than 1,000 are preferable.

Examples of the compound having a phenolic hydroxyl group capable of constituting the dissolution inhibitor include polyphenol compounds having 3 to 5 phenolic hydroxyl groups, e.g., triphenylmethane-based compounds, bis(phenylmethyl)diphenylmethane-based compounds, 1,1-diphenyl-2-biphenylethane-based compounds having a hydroxyl group as a nucleus substituent, and the like. In addition, di- to hexa-nuclear body obtained by formalin condensation of at least one phenol selected from phenol, m-cresol and 2,5-xylenol can be also used.

Moreover, examples of the carboxyl compound having a carboxy group protected by an acid-dissociable dissolution inhibitory group include biphenylcarboxylic acid, naphthalene(di)carboxylic acid, benzoylbenzoic acid, anthracenecarboxylic acid, and the like.

Above all, it is desirable to use a compound (hereinafter, referred to as "DR1") represented by the following general formula (7):

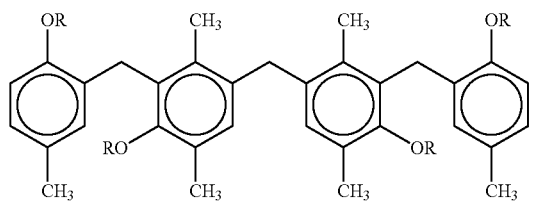

(7)

wherein, R represents a CH$_2$COO-tert-butyl group.

[Organic Solvent]

The photosensitive resin composition of the present invention is produced by dissolving the base resin (A), the acid generator (B), the quencher (C), and the aforementioned optional component if desired, preferably in an organic solvent.

The organic solvent which may be used in the photosensitive resin composition of the present invention may be one which dissolves each used component to give a uniform solution. According to the present invention, a known properly chosen organic solvent which has been conventionally used as the solvent of chemically amplified resists can be used. These organic solvents may be used alone or in combinations of two or more.

The amount of the solvent used is not particularly limited, but may be determined properly depending on the coating film thickness at a concentration capable of being coated on the workpiece film. In general, it is used so that the solid content of the photosensitive resin composition (resist composition) falls within the range of from 2% by mass to 20% by mass, and preferably from 5% by mass to 15% by mass.

Examples of the organic solvent include, e.g., lactones such as γ-butyrolactone; ketones such as acetone, methylethylketone, cyclohexanone, methylisoamylketone, and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or monomethyl ether, monoethyl ether, monopropyl ether, monobutyl ether, or monophenyl ether thereof; cyclic ethers such as dioxane; esters such as methyl lactate, ethyl lactate (EL), methyl acetate, ethyl acetate, butyl acetate, methyl pyruvate, ethyl pyruvate, methyl methoxypropionate, ethyl ethoxypropionate, and the like.

According to the present invention, use of a mixed solvent prepared by mixing propylene glycol monomethyl ether acetate (PGMEA) and a polar solvent is preferred as the organic solvent. The compounding ratio (mass ratio) may be properly determined taking into account miscibility of PGMEA and the polar solvent, but falls within the range of preferably 1:9 to 9:1, and more preferably 2:8 to 8:2.

Furthermore, according to the present invention, a mixed solvent including propylene glycol monomethyl ether (PGME) and a solvent having a higher boiling point than PGME may be preferably used. Accordingly, the shape of the resist pattern such as line edge roughness, line width roughness (nonuniformity of horizontal width of the line), and the like can be improved. In addition, the width in the depth of focus (DOF) at the contact hole can be increased simultaneously.

As the solvent having higher boiling point than PGME, for example, one having a boiling point of higher than 120° C., which is the boiling point of PGME, preferably one having a higher boiling point by no less than 20° C., more preferably one having a higher boiling point by no less than 25° C. may be used among the above-described solvents. Additionally, the upper limit of the boiling point is not particularly limited, but it is preferably approximately 200° C. or lower. Examples of such a solvent include, e.g., propylene glycol monomethyl ether acetate (boiling point: 146° C.), EL (boiling point: 155° C.), γ-butyrolactone (boiling point: 204° C.), and the like. The amount of PGME included in the mixed solvent is preferably from 10% by mass to 60% by mass, and more preferably from 20% by mass to 40% by mass. When the amount of PGME included in the mixed solvent falls within this range, a composition that is superior in the aforementioned effects can be obtained.

Bilayer Resist System

The photosensitive resin composition of the present invention can be suitably used in a method for patterning of a support using bilayer resist. When the resist composition of the present invention is used as a material for the upper layer of a bilayer resist system, to provide a pattern having an excellent cross-sectional shape as well as low line edge roughness and edge roughness of the hole pattern (may be referred to as "edge roughness" in combination) with high sensitivity and high resolution is enabled.

[Resist Layered Product of Bilayer Resist System]

Figure 1B:
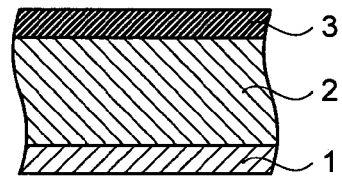

In the resist layered product of the bilayer resist system, a lower layer film ("2" in FIG. 1B) which is insoluble in an alkali developer and can be dry etched, and an upper layer film ("3" in FIG. 1B) constituted with the photosensitive resin composition of the present invention are laminated on a workpiece film ("1" in FIG. 1B).

Although the thickness of the upper layer film 3 and the lower layer film 2 in the resist layered product of the bilayer resist system may be properly selected based on the balance of the intended aspect ratio and the through put taking into consideration the time period required for dry etching, in general, total thickness of the upper layer film 3 and the lower layer film 2 is preferably equal to or less than 15 μm and more preferably equal to or less than 5 μm. Although the lower limit of the total thickness is not particularly limited, it is preferably no less than 0.1 μm, and more preferably no less than 0.35 μm.

The thickness of the upper layer film 3 is preferably from 50 nm to 1,000 nm, more preferably from 50 nm to 800 nm, and still more preferably from 100 nm to 500 nm. The thickness of the upper layer film 3 falling within this range leads to effects of enabling formation of the resist pattern with high resolution, and attaining enough resistance to the dry etching, and the like.

The thickness of the lower layer film 2 is preferably from 200 nm to 20,000 nm, more preferably from 300 nm to 8,000 nm, and still more preferably from 400 nm to 5,000 nm. The thickness of the lower layer film 2 falling within this range leads to effects of enabling formation of the resist pattern with a high aspect ratio, and attaining enough resistance to the etching in the etching of the workpiece film.

In the method for pattern formation by means of the bilayer resist system of the present invention, for example, the thickness of the upper layer film 3 may be from 50 nm to 1,000 nm, while the thickness of the lower layer film 2 may be from 200 nm to 20,000 nm. According to the present invention, a pattern having a small pattern width and a high aspect ratio (pattern of lower layer film 2) can be formed even in the case of such a film thickness. Thus, the pattern provided using the photosensitive resin composition of the present invention can be suitably utilized for electron radiations, pattern formation of magnetic films as well as other micromachining applications and the like, particularly in the field in which microprocessing is demanded.

In the resist layered product that has a resist pattern formed thereon, it is desired that a pattern with a high aspect ratio be formed without causing pattern collapse and the like because the pattern with a higher aspect ratio can form a micropattern on a workpiece film with higher degree of precision.

The aspect ratio referred to herein is a ratio (y/x) of the height y of the lower layer film 2 to the pattern width x of the resist pattern. The pattern width x of the resist pattern is the same as the pattern width after transferring to the lower layer film 2.

The pattern width refers to the width of a ridge (line) in the cases of the resist pattern being a linear pattern such as a line and space pattern, an isolated line pattern or the like. When the resist pattern is a hole pattern, the pattern width refers to the inside diameter of the formed hole. Also, when the resist pattern is a columnar dot pattern, the pattern width refers to the diameter of the dot. It should be noted that any of these pattern widths is the width at the bottom of the pattern.

According to the positive type resist composition of the present invention, the pattern with a high aspect ratio can be readily provided. In the case of a dot pattern or isolated line pattern, for example, on the lower layer film having a film thickness of 2.5 μm, a dot pattern isolated line pattern having an aspect ratio of from 8 to 20 can be produced, which cannot be attained with conventional resist compositions. In the case of a trench pattern, for example, on the lower layer film having a film thickness of 2.5 μm, a trench pattern having an aspect ratio of from 10 to 20 can be produced, which cannot be attained with common resist composition. In any case, the limit of the aspect ratio has been approximately 5 according to conventional resist compositions.

Pattern Formation by Bilayer Resist System

FIG. 1A to FIG. 1F shows process drawings illustrating steps for pattern formation on a workpiece film by lithography according to the present invention. In an embodiment of the present invention, a lower layer film formation step (FIG. 1A), an upper layer film formation step (FIG. 1B), a first baking step (not shown in the FIGURE), an exposure step (FIG. 1C), a second baking step (not shown in the FIGURE), a development step (FIG. 1D), and an etching step (FIGS. 1E and F) are involved. Hereinafter, each step will be explained.

[Lower Layer Film Formation Step]

FIG. 1A shows a view illustrating the lower layer film formation step of a method for pattern formation according to the embodiment of the present invention. In the lower layer film formation step, a material for forming lower layer film 2 is coated onto workpiece film 1 to give the lower layer film 2.

The material of the workpiece film 1 used in the present invention is not particularly limited, and a conventionally known material can be used, which may be properly selected to suit the final applications of the pattern provided by the present invention. In the present invention, the application may be, for example, workpiece films for electronic parts, films having a predetermined wiring pattern formed thereon, and the like, more particularly, workpiece films of a metal such as a silicon wafer, copper, chromium, iron or aluminum, glass workpiece films, and the like. In addition, as the material of the wiring pattern, for example, copper, aluminum, nickel, gold or the like can be used.

The method of coating a material for forming the lower layer film 2 on the workpiece film 1 is not particularly limited, and for example, a spray coating method, a roll coating method, a spin-coating method or the like can be selected appropriately depending on the material that forms the lower layer film 2. When spin coating is conducted using a spinner or the like, it is desired to carry out a baking treatment under a condition of a temperature of preferably from 180° C. to 300° C. for a period of time of no shorter than 30 sec and no longer than 300 sec, and more preferably no shorter than 60 sec and no longer than 180 sec.

In the present embodiment, an organic or inorganic antireflection film may be also provided between the resulting lower layer film 2 and the upper layer film 3 described later.

The material for forming the lower layer film 2 is not particularly limited, and any material which is insoluble in an alkali developer used in the development after the exposure, and which can be etched by a conventional dry etching method is acceptable. Also, the material for forming the lower layer film 2 does not always need photosensitivity as the material for forming the upper layer film 3 (the photosensitive resin composition of the present invention). According to the present invention, a resist composition or a resin solution which has been generally employed as a base material in manufacture of semiconductor elements and the liquid crystal display elements can be used.

Among all, use of a resist composition or a resin solution of an organic polymer that forms an organic polymer film is preferred, in light of capability of etching by the oxygen-based plasma and/or reactive ion since current environmental issues can be dealt with.

As the material for forming such lower layer film 2, one containing as a principal component at least one selected from the group consisting of a novolak resin, an acrylic resin and a soluble polyimide is preferably used. The materials which contain such a resin as a principal component can be readily etched by the oxygen plasma, and are highly resistant to a fluorocarbon gas which is generally used in etching of silicon workpiece films and the like in the following step.

In particular, novolak resins, and acrylic resins having an alicyclic site or an aromatic ring on the side chain are particularly preferably used since they have been universally used at low costs, and are excellent in dry etching resistance by the fluorocarbon gas used in the following step.

As the novolak resin which is a preferable material for forming the lower layer film 2, any one generally used in positive type resist compositions can be used, and positive type resists for i-ray or g-ray which contain a novolak resin as a principal component can be also used.

The novolak resin refers to a resin which is obtained by subjecting an aromatic compound having a phenolic hydroxyl group (hereinafter, merely referred to as "phenols") and an aldehyde to addition condensation in the presence of an acid catalyst. Examples of the phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, p-phenylphenol, resorcinol, hydroquinone, hydroquinone monomethyl ether, pyrogallol, phloroglucinol, hydroxydiphenyl, bisphenol A, gallic acid, gallic acid ester, α-naphthol, β-naphthol, and the like.

In addition, examples of the aldehydes include formaldehyde, furfural, benzaldehyde, nitrobenzaldehyde, acetaldehyde, and the like.

Although the catalyst used in the addition condensation reaction is not limited in particular, for example, as the acid catalyst, hydrochloric acid, nitric acid, sulfuric acid, formic acid, oxalic acid, acetic acid or the like can be used.

The novolak resin obtained in this manner preferably has a mass average molecular weight (Mw) of usually from 3,000 to 10,000, preferably from 6,000 to 9,000, and more preferably from 7,000 to 8,000. When the mass average molecular weight is less than 3,000, sublimation may occur when baked at a high temperature, while the mass average molecular weight exceeding 10,000 is not preferred since dry etching tends to be difficult.

Commercially available novolak resin can be also used, for example, BLC-100 (trade name; manufactured by Tokyo Ohka Kogyo Co., Ltd) may be exemplified as a commercial resin. In particular, the novolak resin having a mass average molecular weight (Mw) of from 5,000 to 50,000, preferably from 8,000 to 30,000, and the content of low-nuclear body, which has a molecular weight of no greater than 500 and preferably no greater than 200, as determined by a gel permeation chromatography process (GPC process) of no greater than 1% by mass, and preferably no greater than 0.8% by mass is preferably used. The content of the low nuclear body is preferably as low as possible, and is desirably 0% by mass.

The novolak resin having Mw of no greater than 50,000 achieves excellent implantation characteristics into the workpiece film having minute irregularity, while the novolak resin having Mw of no less than 5,000 achieves favorable etching resistance to the fluorocarbon gas.

Also, by defining the content of the low-nuclear body having a molecular weight of no greater than 500 to be no greater than 1% by mass, implantation characteristics into the workpiece film having minute irregularity may be favorable. Although the grounds for achieving favorable implantation characteristics by reducing the content of the low-nuclear body are nor clear, it is speculated to result from lowered degree of dispersion.

The "low-nuclear body having a molecular weight of no greater than 500" refers to a matter which is detected as a low-molecular fraction of the molecular weight being no greater than 500, as analyzed by a GPC process using polystyrene as a standard. The "low-nuclear body having a molecular weight of no greater than 500" may include unpolymerized monomer, those having a low polymerization degree, for example, condensation products of an aldehyde and two to five molecules of phenols, which may vary depending on the molecular weight, and the like.

The content (% by mass) of the low-nuclear body having a molecular weight of no greater than 500 is measured by: graphic representation of the analytical results by the GPC process, with taking the fractionation number along the abscissa, and the concentration along the ordinate; and determining the ratio (%) of the area under the curve corresponding to the low-molecular fraction of the molecular weight of no greater than 500 to the entire area under the curve.

As the acrylic resin that is a preferred material for forming the lower layer film 2, any one generally used in positive type resist compositions can be used, for example, acrylic resins having a constitutional unit derived from a polymerizable compound having an ether linkage, and a constitutional unit derived from a polymerizable compound having a carboxy group can be exemplified.

Illustrative examples of the polymerizable compound having an ether linkage include (meth)acrylic acid derivatives having an ether linkage and an ester linkage such as 2-methoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolypropylene glycol (meth)acrylate, tetrahydrofurfuryl (meth)acrylate, and the like. These compounds may be used alone, or in combination of two or more.

Illustrative examples of the polymerizable compound having a carboxy group include compounds having a carboxy group and an ester linkage such as e.g., monocarboxylic acid such as acrylic acid, methacrylic acid, and crotonic acid; dicarboxylic acid such as maleic acid, fumaric acid, and itaconic acid; 2-methacryloyloxyethylsuccinic acid, 2-methacryloyloxyethylmaleic acid, 2-methacryloyloxyethylphthalic acid, 2-methacryloyloxyethylhexahydrophthalic acid, and the like, and acrylic acid or methacrylic acid is preferred. These compounds may be used alone or in combination of two or more.

Moreover, the soluble polyimide which is a preferable material for forming the lower layer film 2 may be polyimide which can be liquidified by the organic solvent as described above.

[Upper Layer Film Formation Step]

FIG. 1B shows a view illustrating an upper layer film formation step of the method for pattern formation according to the embodiment of the present invention. In the upper layer film formation step according to the present embodiment, the photosensitive resin composition of the present invention is coated on the lower layer film 2 provided as described above to form the upper layer film 3 of the photosensitive resin composition, whereby a layered product for forming a resist film is obtained.

The method of coating the photosensitive resin composition of the present invention on the lower layer film 2 is not particularly limited, and for example, a spray coating method, a roll coating method, a spin-coating method or the like can be exemplified.

In the method for pattern formation of the present embodiment, even though a pattern with a high aspect ratio is to be formed, the upper layer film can be thinned because the resist pattern is formed by the bilayer resist system in which the lower layer film and the upper layer are laminated.

In addition, when the upper layer film is thinned, in general, edge roughness such as line edge roughness and edge roughness of the hole pattern tends to be marked while resolution improves. However, since the upper layer film constituted with the photosensitive resin composition of the present invention exhibits suitable solubility in alkali even though it is thinned, a high degree of resolution can be attained, and occurrence of the edge roughness can be reduced.

[First Baking Step]

In the first baking step, the upper layer film 3 constituted with the photosensitive resin composition provided on the lower layer film 2 in the upper layer film formation step is baked or semi-baked to form a cured film or semi-cured film. The first baking step in the present invention is an optional step, and may be provided if necessary, depending on the type of the photosensitive resin composition.

The conditions of the baking or semi-baking are not particularly limited. For example, heating under a condition of a temperature of from 70° C. to 130° C. for a period of time of from 40 sec to 180 sec, and preferably from 60 sec to 90 sec is desired. In particular, it is advantageous to preset the heating temperature in the first baking step to fall within the range from 70° C. to 90° C. for preventing the occurrence of the white edge.

[Exposure Step]

Figure 1C:
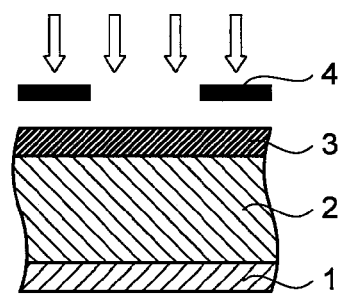

FIG. 1C shows a view illustrating the exposure step in the method for pattern formation according to the embodiment of the present invention. In the exposure step, the upper layer film 3 constituted with the photosensitive resin composition which was obtained by carrying out the baking or semi-baking in the first baking step is exposed via a photomask 4 (shown in the FIGURE by an arrow) to give an exposed film having a selectively exposed region at least in part.

The acid generator (A) included in the photosensitive resin composition of the present invention generates an acid in response to the exposed light, and the base resin (A) affected by the action of the generated acid increases its solubility in an aqueous alkali solution. Accordingly, difference in solubility in the developer occurs between the exposed regions and unexposed regions, and the exposed regions are removed away through dissolution in the following development step.

The exposure device which may be used is not particularly limited. As a light source for exposure, any radiation may be used including, for example, KrF excimer laser, ArF excimer laser, F2 excimer laser, electron beams, EUV (Extreme Ultra Violet), VUV (Vacuum Ultra Violet), X-ray, soft X-ray, and the like. Among these, it is preferable to use the electromagnetic wave at a wavelength shorter than that of KrF in the present invention, and in particular, ArF is preferably used.

For the coating layer constituted with the photosensitive resin composition of the present invention, electron beams can be suitably used in light of capability of attempting advanced microprocessing because favorable rectangularity of the cross-sectional shape and line edge roughness of the pattern can be attained, and issues of pattern collapse and the like can be avoided even in the case in which a micro resist pattern is formed.

The method for exposure which may be used in the exposure step of the present invention is not particularly limited as long as light and/or heat can be applied to the necessary region of the upper layer film. For example, selective irradiation using a photomask, drawing by an electron beam, and the like can be exemplified. In addition, so-called immersion lithography can be also adopted in which exposure (exposure in liquid immersion) is carried out while allowing a solvent (liquid immersion medium) having a refractive index higher than that of air to be filled in a part between the upper layer film of the workpiece film and the lens, which has been conventionally filled with an inert gas such as air or nitrogen in the exposure.

The conditions of the exposure in the exposure step are not particularly limited. The exposure region, the exposure time period, the exposure intensity, and the like can be properly selected depending on the light source and method used in the exposure.

[Second Baking Step]

In the second baking step, the exposed film including at least in part an exposed region is further baked. In the method for pattern formation of the present invention, the second baking step is an optional step.

The baking conditions of the second baking step are not particularly limited. For example, heating under a condition of a temperature of from 70° C. to 130° C. for a period of time of from 40 sec to 180 sec, and preferably from 60 sec to 90 sec is desired.

[Development Step]

Figure 1D:
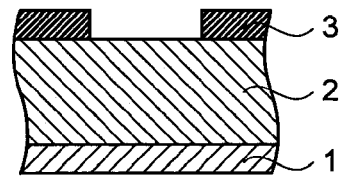

FIG. 1D shows a view illustrating a development step in the method for pattern formation according to the embodiment of the present invention. In the development step, the exposed regions of the exposed film obtained following the exposure step and the second baking step as needed are selectively dissolved by a developer, whereby a resist film having the formed pattern constituted with the photosensitive resin composition is obtained.

FIG. 1C shows a state in which the exposed regions of the exposed film are dissolved in response to the exposure in the exposure step. The exposed regions of the upper layer film 3 are removed away through dissolution, thereby leaving the unexposed regions as a pattern.

The alkali developer which may be used in the development step is not particularly limited. For example, an aqueous tetramethylammoniumhydroxide solution from 0.05% by mass to 10% by mass, and preferably from 0.05% by mass to 3% by mass can be used. In the present embodiment, the development step enables the resist pattern to be formed on the upper layer film such that the mask pattern is strictly reproduced.

The shape of the resist pattern obtained by the present embodiment has a high aspect ratio, and has excellent verticality without pattern collapse.

[Etching Step]

Figure 1E:
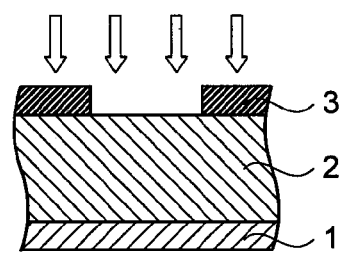
Figure 1F:
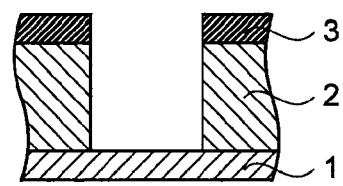

FIG. 1E and FIG. 1F are views illustrating an etching step. In the etching step, the lower layer film is removed through etching by irradiating a plasma and/or reactive ion (shown by arrowheads) using the pattern as a mask onto the layered product having the resist film with the pattern formed thereon.

The plasma and/or reactive ion gas used in the etching step is not particularly limited as long as it has been generally used in the field of dry etching. For example, oxygen, halogen, sulfur dioxide can be exemplified, and the plasma and/or reactive ion including oxygen is preferably used because the resulting pattern will have high resolution, and it has been universally used. When the plasma and/or reactive ion including oxygen is used, high etching resistance can be realized when a silsesquioxane resin is selected as the base resin (A).

The method for etching is not particularly limited. For example, a known method such as chemical or physical etching, e.g., chemical etching such as down flow etching or chemical dry etching; physical etching such as sputter etching or ion beam etching; RIE (reactive ion beam); or the like can be used.

Most common dry etching may involve parallel plate type RIE. In this method, the layered product having the resist pattern formed thereon is first placed in a chamber of an RIE apparatus, and a necessary etching gas is introduced. When a high-frequency voltage is applied to the holder of the resist layered product placed parallel to the upper electrode in the chamber, the gas is turned into the plasma. In the plasma, charged particles such as positive/negative ions and electrons, as well as neutral active species are present as the etching species. When these etching species are adsorbed on the bottom organic layer, a chemical reaction is caused, whereby the reaction products are detached from the surface and discharged outside, leading to progress of the etching.

EXAMPLES

Next, the present invention will be explained in more detail with reference to Examples; however, the present invention should not be construed as being limited thereto.

Synthesis Example 1

Preparation of Hydrogen Silsesquioxane (HSQ) Solution 100 g of a toluenesulfonate monohydrate (TSAM) solution prepared by sulfonation using conc. H2SO4 and fuming SO3 was placed into a 500 mL flask equipped with a dehydrator, a thermometer, magnetic stirrer bar and a nitrogen bubbler. Subsequently, 50 g of a toluene solution of trichlorosilane (10 g, 0.075 mol) was added dropwise to the flask while keeping stirring vigorously to give a mixture. Thus resulting mixture was washed with deionized water at least three times, and thereafter the organic phase was extracted. The solvent of the extracted organic phase was removed by a rotary evaporator under reduced pressure, whereby a hydrogen silsesquioxane resin having a solid content in the range of 5-25% was obtained. The obtained resin solution is used as the HSQ solution.

[Introduction of Acid-Dissociable Group]

About 0.1 mol of bicyclo[2,2,1]hept-5-ene-2-t-butylcarboxylate and anhydrous toluene (50:50) are mixed to prepare an olefin solution. To the resulting olefin solution was added 200 ppm 1,3-diethenyl-1,1,3,3-tetramethyldisiloxane complex (platinum, concentrated). Subsequently, this olefin solution was placed into a flask equipped with a dehydrator, a thermometer, a magnetic stirrer bar and a nitrogen bubbler. Thereafter, nitrogen was purged, and the HSQ solution (containing 0.33 mol of HSQ) prepared as described above was added slowly to the olefin solution. After the addition, this system was refluxed for 8 hrs while stirring gently. The dehydrating silylation reaction was monitored using 1H-NMR until the peak of olefin completely disappeared.

[Preparation of Silsesquioxane Resin]

By solvent displacement with a desired solvent such as propylene glycol methyl ether acetate (PGMEA), ethyl lactate (EL), isobutyl ketone (MIBK) or methyl n-amyl ketone (MAK), a final silsesquioxane resin solution having a solid content of 4-45% was obtained.

Example 1

Preparation of Photosensitive Resin Composition

A positive type photosensitive resin composition (resist composition) was obtained by dissolving 100 parts by mass of the resin obtained in Synthesis Example 1, 4.5 parts by mass of a compound (manufactured by Wako Pure Chemical Industries, Ltd., trade name: WPAG-469) represented by the following general formula (8) as the acid generator, 2.0 parts by mass of a triphenylsulfonium compound (hereinafter, referred to as TPS-OH) represented by the following general formula (9) as the quencher, 0.36 parts by mass of malonic acid as the organic acid in a mixed solvent of propylene glycol monomethyl ether acetate: propylene glycol monomethyl ether=8:2 (mass ratio), and adjusting the solid content to be 5% by mass. Details of the photosensitive resin composition are shown in Table 1.

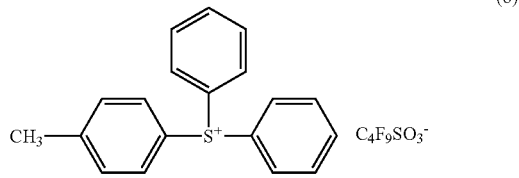

(8)

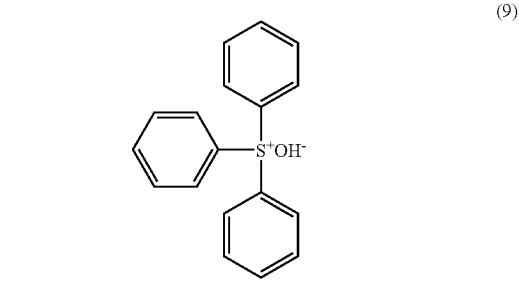

(9)

Thus resulting photosensitive resin composition was stored in two ways, i.e., (i) at 0° C., and (ii) at 60° C. for 6 six hours.

[Formation of Lower Layer Film]

On a silicon workpiece film, BLC-720 (manufactured by Tokyo Ohka Kogyo Co., Ltd.) as a lower layer film material was coated using a spinner, and a baking treatment at 100° C. and 180° C. for each 90 sec was carried out to form a lower layer film having a film thickness of 210 nm. [Coating of Photosensitive Resin Composition]

On the resulting lower layer film was coated the photosensitive resin composition (i) or (ii) obtained as described above using a spinner. After conducting a prebaking treatment at 85° C. for 90 sec, the coated film having a film thickness of 100 nm was each formed through drying, whereby layered products for forming a resist pattern were obtained.

[Exposure]

Next, an ArF excimer laser (193 nm) was selectively irradiated by means of an ArF exposure system (trade name: NSR-S302A, manufactured by Nikon Corporation; NA (numerical aperture)=0.60, σ: 2/3 orbicular zone).

[Development]

After the irradiation, a post exposure baking (PEB) treatment was conducted at 95° C. for 90 sec, and then a development treatment was further conducted with an alkali developer (2.38 mol % aqueous tetramethylammonium hydroxide solution) at 23° C. for 60 sec. [Rinsing]

Subsequently, a rinsing treatment was conducted with pure water for 30 sec, followed by postbaking at 100° C. for 60 sec to obtain a resist pattern. Thus obtained resist pattern was a vertical line and space (L & S) pattern of 110 nm.
[Evaluation]
Sensitivity with Time In evaluation of the sensitivity with time, the line width for every light exposure was plotted on each of: (i) the photosensitive resin composition stored at 0° C.; and (ii) the photosensitive resin composition stored at 60° C. for 6 hrs, whereby the ratio ((ii)/(i)) of the light exposure corresponding to the sensitivity (EOP) that provided the designed dimension was determined. The results are shown in Table 1.

TABLE 1

|  | Example 1 | Comparative Example 1 |
| --- | --- | --- |
| Resin | Synthesis Example 1 | Synthesis Example 1 |
|  | 100 parts by mass | 100 parts by mass |
| Acid | WPAG-469 | WPAG-469 |
| generator | 4.5 parts by mass | 4.5 parts by mass |
| Quencher | TPS-OH | Triisopropanolamine |
|  | 2.0 parts by mass | 0.623 parts by mass |
|  |  | Triethylamine |
|  |  | 0.02 parts by mass |
| Organic | Malonic acid | Malonic acid |
| acid | 0.36 parts by mass | 0.339 parts by mass |
| Solvent | Propylene glycol | Propylene glycol |
|  | monomethyl ether | monomethyl ether |
|  | acetate:propylene | acetate:propylene |
|  | glycol monomethyl | glycol monomethyl |
|  | ether = 8:2 | ether = 8:2 |
| Sensitivity | 98.79% | 87.18% |
| with time |  |  |

Comparative Example 1

Preparation of Photosensitive Resin Composition

A positive type photosensitive resin composition was obtained similarly to Example 1 except that 0.623 parts by mass of triisopropanolamine and 0.02 parts by mass of triethylamine were used in place of TPS-OH as the quencher. Details of the photosensitive resin composition are shown in Table 1.

A layered product for forming a resist pattern was obtained by a similar operation to Example 1 using the resulting photosensitive resin composition, followed by conducting the exposure treatment, development treatment, and rinsing treatment to obtain a resist pattern. In addition, the sensitivity with time was evaluated using the obtained photosensitive resin composition in a similar manner to Example 1. The results are shown in Table 1.

As shown in table 1, the resist pattern obtained from the photosensitive resin composition of Comparative Example 1 was inferior in sensitivity with time, and a thinner line was provided at the same light exposure. To the contrary, the photosensitive resin composition of Example 1 exhibited stable sensitivity over time.

The invention claimed is:
1. A photosensitive resin composition comprising:
(A) a base resin comprising a silsesquioxane resin and having a property to increase the solubility in an aqueous alkaline solution by the action of an acid,
(B) an acid generator that generates an acid in response to an electromagnetic wave, and
(C) a quencher that captures the acid,
and the quencher (C) comprises a sulfonium compound represented by the following general formula:

wherein $R_1$, $R_2$ and $R_3$ each independently represent an alkyl group, a cycloalkyl group which may have a substituent, or an aryl group which may have a substituent.

2. The photosensitive resin composition according to claim 1 wherein the quencher (C) comprises a triphenyl compound represented by the following formula (2):

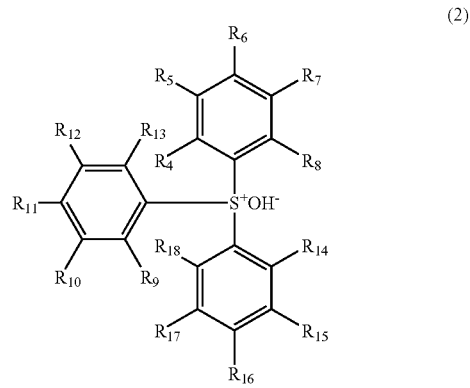

wherein $R_4$ to $R_{18}$ each independently represent a hydrogen atom, a halogen atom, or an alkyl group having 1 to 20 carbon atoms.

3. The photosensitive resin composition according to claim 1 wherein the quencher (C) comprises a tricyclohexyl compound represented by the following general formula (3):

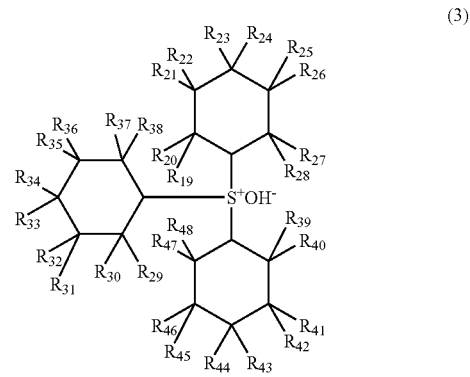

wherein $R_{19}$ to $R_{48}$ each independently represent a hydrogen atom, a halogen atom, or an alkyl group having 1 to 20 carbon atoms.

4. The photosensitive resin composition according to claim 1 wherein: the base resin (A) comprises a silsesquioxane resin having an $HSiO_{3/2}$ unit, and an $RSiO_{3/2}$ unit, wherein R is an acid-dissociable group represented by the following general formula (4):

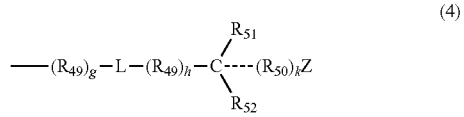

(4)

wherein:

$R_{49}$ is each independently a linking group;

$R_{50}$ is the second linking group;

L is selected from the group consisting of a linear or branched alkylene group having 1 to 10 carbon atoms, a fluoroalkylene group, a substituted or unsubstituted arylene group, a substituted or unsubstituted cycloalkylene group, and a substituted or unsubstituted alkarylene group having 2 to 20 carbon atoms;

$R_{51}$ is a hydrogen atom, or a linear or branched alkyl group or fluoroalkyl group;

$R_{52}$ is an alkyl group or a fluoroalkyl group;

Z is a group that is dissociable by an acid;

g represents an integer of 0 or 1;

h represents an integer of 0 or 1; and k represents an integer of 0 or 1.

5. The photosensitive resin composition according to claim 1, wherein the content of the acid generator (B) is from 0.5 parts by mass to 30 parts by mass per 100 parts by mass of the base resin (A).

6. The photosensitive resin composition according to the claim 1, wherein the content of the quencher (C) is from 0.01 parts by mass to 5.0 parts by mass per 100 parts by mass of the base resin (A).

7. The photosensitive resin composition according to claim 1, which further comprises an organic acid (D) in an amount of 0.01 parts by mass to 5.0 parts by mass per 100 parts by mass of the base resin (A).

8. The photosensitive resin composition according to claim 1 which is a composition for a resist.

9. The photosensitive resin composition according to claim 1 which is a composition for an upper layer resist of a bilayer resist system.

10. The photosensitive resin composition according to claim 1 which is a composition for an upper layer resist of a bilayer resist system having an organic polymer film as the lower layer.

11. A method for pattern formation by lithography on a workpiece film comprising:

forming a lower layer film on a workpiece film;

forming an upper layer film by coating the photosensitive resin composition according to claim 1 on the lower layer film to obtain an upper layer film;

exposing the upper layer film to obtain an exposed film including at least in part an exposed region; and developing the exposed film by treating with a developer to selectively dissolve the exposed region of the upper layer film thereby obtaining a resist film having a pattern formed thereon constituted with the photosensitive resin composition.

12. The method for pattern formation according to claim 11 wherein the lower layer film is an organic polymer film.

13. The method for pattern formation according to claim 11 which comprises etching after the development step to etch the lower layer film by a plasma and/or reactive ion using the resist film as a mask.

14. The method for pattern formation according to claim 13 wherein the plasma and/or reactive ion comprises oxygen.

* * * * *